United States Patent [19]

Petersen

[11] Patent Number: 4,780,040
[45] Date of Patent: Oct. 25, 1988

[54] CONVEYOR GUIDE ARRANGEMENT

[75] Inventor: Paul S. Petersen, Minnetonka, Minn.

[73] Assignee: Research, Incorporated, Eden Prairie, Minn.

[21] Appl. No.: 131,756

[22] Filed: Dec. 11, 1987

[51] Int. Cl.$^4$ ............................................. B65G 17/06
[52] U.S. Cl. .................................. 414/157; 195/817; 195/841; 195/860.3; 432/245
[58] Field of Search ............... 414/157, 187, 196; 195/860.3, 817, 814, 841; 432/239, 245

[56] References Cited

U.S. PATENT DOCUMENTS

| | | | |
|---|---|---|---|
| 675,281 | 5/1901 | Johnson | 432/245 X |
| 964,191 | 7/1910 | Steele | 198/817 X |
| 1,151,355 | 8/1915 | Gottschalk | 198/817 X |
| 2,975,885 | 3/1961 | Grundelman | 198/814 X |
| 3,391,658 | 7/1968 | Williams | 432/245 |
| 3,857,478 | 12/1974 | Meeusen | 198/817 X |
| 3,965,523 | 6/1976 | Elliott | 198/817 X |
| 4,030,595 | 6/1977 | McCombie | 198/778 |
| 4,062,459 | 12/1977 | Robertson | 414/157 |
| 4,253,343 | 3/1981 | Black et al. | 198/814 X |
| 4,269,303 | 5/1981 | Cornell | 198/733 |
| 4,311,458 | 1/1982 | Caratsch | 432/121 |
| 4,353,459 | 10/1982 | Peterschack | 198/852 |
| 4,505,692 | 3/1985 | Boos et al. | 198/817 X |
| 4,558,779 | 12/1985 | Schmitt et al. | 198/627 |
| 4,582,972 | 4/1986 | Cartin et al. | 198/817 X |
| 4,613,278 | 9/1986 | Bilsing | 414/736 |

Primary Examiner—Robert J. Spar
Assistant Examiner—David A. Bucci
Attorney, Agent, or Firm—Kinney & Lange

[57] ABSTRACT

A conveyor with a frame and a guide rail for guiding the movable member supported on the frame with a tension imparting arrangement which applies a tensile force between the ends of the guide rail.

20 Claims, 4 Drawing Sheets 4,780,040

CONVEYOR GUIDE ARRANGEMENT

BACKGROUND OF THE INVENTION

The present invention relates to conveyor systems and, more particularly, to conveyor systems which must convey selected items placed thereon from a region of one temperature to a region of a significantly different temperature while supporting such items at edges thereof.

Conveyors are used for many purposes. Among them is the transporting of items to be heated from an unheated access region into a heating region. In those situations where there is a significant temperature difference between the heating region and the access region, the conveyor is subject to substantial thermal gradients. Such thermal gradients can lead to substantial stresses on the conveyor structural components. The conveyor structural components must be capable of operating in these conditions.

One kind of conveyor encountering these conditions is a conveyor for supporting the edges of printed circuit boards that are to be conveyed from an access zone into a heating zone for the purpose of causing affixing thereto of electronic components thereon. The supporting of these printed circuit boards at edges thereof only permits both sides of the printed circuit board to be heated simultaneously to cause such fixation, or heated alternatively for this purpose in subsequent passes through the heating zone. This capability is desirable in the fabrication of many kinds of printed circuit board systems.

A conveyor for accomplishing this can be provided by use of a pair of chains which, in one manner or another, support edges of circuit boards between them. The chains can then be driven by an actuation means connected to sprockets around which the chains are arrayed. The metallic nature of the chains provides a conveying means which can withstand substantial stresses.

Such chains must each be guided by some kind of a guiding arrangement to permit the chains to move while causing them to stay a selected distance from one another if the printed circuit boards are to be continuously supported at their edges without coming off either chain. Since only a very small portion of the edges of a circuit board will be over each chain, a rather small tolerance in the spacing of one chain from the other is permitted. Thus, the guide rails must set a rather accurate path along which the chains can move.

Choosing a guide rail construction to meet this requirement usually comes down to two choices. One is a guide rail having substantial cross-sectional dimensions so that it is quite rigid but with relatively little support on the conveyor frame, perhaps just at each end. The alternative is providing frequent supports on the conveyor frame if the guide rail is to have smaller cross-sectional dimensions.

A relatively larger but rigid rail is definitely more costly to use than is a rail of a smaller dimensional construction. A further difficulty with a relatively large rigid rail is that heating will cause such a rail to expand, and this expansion can lead to the rail bending between its support points on the frame with the result that the rail has a bow in it so that it has a portion with a lateral displacement away from its desired location. Such a displacement will carry the chain with it leading to the possibility of the edge-supported printed circuit boards being carried thereby falling from the chain.

The use of more supports generally, whether with such a relatively large, rigid guide rail or one of less rigid construction, leads to greater heat losses because of heat transfer through such supports to the conveyor frame. Further, with the rail situated inside a heating region, adjustment of the rail to its desired location can be quite difficult because of the lack of good access to the rail and such supports.

Thus, there is desired, for a conveyor extending into a heating zone using a guide rail, an arrangement which will stiffen the guide rail against lateral displacement of portions theeof due to forces tending to cause such displacement without having to use a relatively large cross section rigid rail, and without having to use a large number of rail supports. In addition, the arrangement should allow a rail to be selectively moved laterally with respect to the direction of travel of the chain to permit adjustment for carrying selected items of varying widths.

SUMMARY OF THE INVENTION

The present invention provides a conveyor with a frame means and a guide rail for guiding a movable transport member, this guide rail being supported on the frame means with a tension imparting means which applies a tensile force between the ends of the guide rail. The same arrangement can be provided with a second substantially parallel guide rail in such a manner that one of them can be allowed to move relatively closer to or further from the other. The movable transport member is formed by chains protected by shields in the radiant heating zone into which the conveyor can extend.

DETAILED DESCRIPTION OF THE PREFERRED EMBODIMENTS

Figure 1:
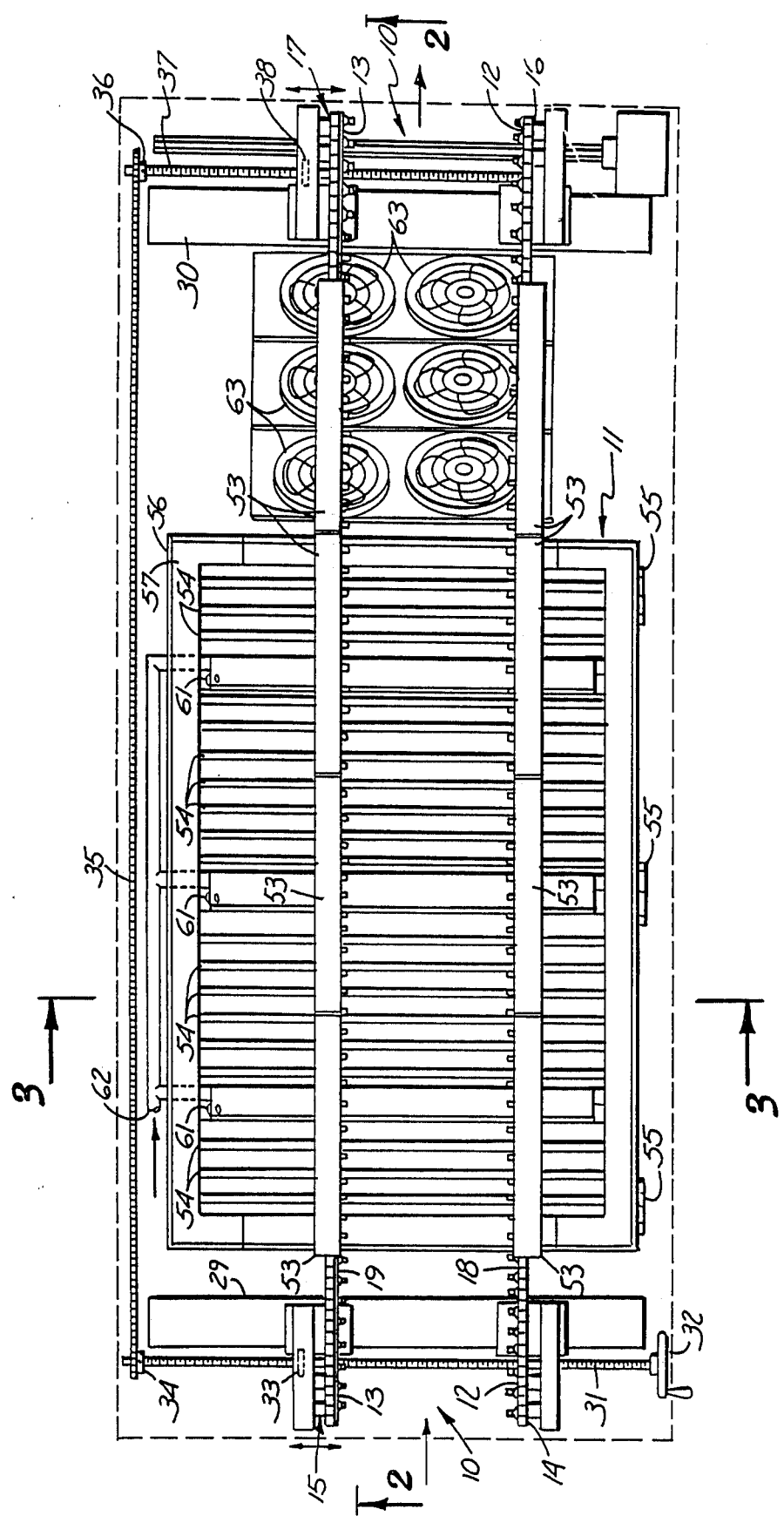
FIG. 1 shows a top view of an embodiment of the present invention.

FIG. 1 shows a partial view from the top of a solder reflow system using radiant, or infrared, heating to cause the reflow of solder paste present on a circuit board, or a component attached to that circuit board, or both. The controls for this system, the upper bank of radiant tubes for the heating chamber, details of the drive actuator and other structural details and features are omitted for clarity. A dashed-line rectangle outside the structural features shown represents the system outer covering which has also been otherwise omitted for purposes of clarity.

A conveyor system, 10, is used to transport printed circuit boards, with surface mount electronic components provided thereon, into a heating chamber, 11, where the solder paste provided between the components of the board is reflowed to provide a solder connection between the component terminals and the printed circuit board interconnection system terminals. Conveyor system 10 comprises a pair of chains, 12 and 13, which are transporting members, or form the transport member, of conveyor system 10 operating as an edge conveyor. That is, conveyor 10 will support circuit boards being transported only at the edges thereof, thereby leaving both the undersides and the tops of the boards directly exposed to radiant tubes for the purposes of heating in heating chamber 11.

Each of chains 12 and 13 travel over idler sprockets at the extremes of the chains as shown in FIG. 1. Chain 12 goes over an input idler sprocket, 14, and chain 13 goes over an input idler sprocket, 15. Chain 12 also goes over an output idler sprocket, 16, while chain 13 additionally goes over another output idler sprocket, 17.

Each of chains 12 and 13, between its corresponding input and output idler sprockets, travels on and is guided by a corresponding guide rail which is located between the upper and lower banks of heating chamber 11, and so over the lower bank of heating chamber 11 as shown in FIG. 1. Chain 12 runs over a stationary guide rail, 18. Chain 13, however, runs over a movable guide rail, 19.

Figure 2:
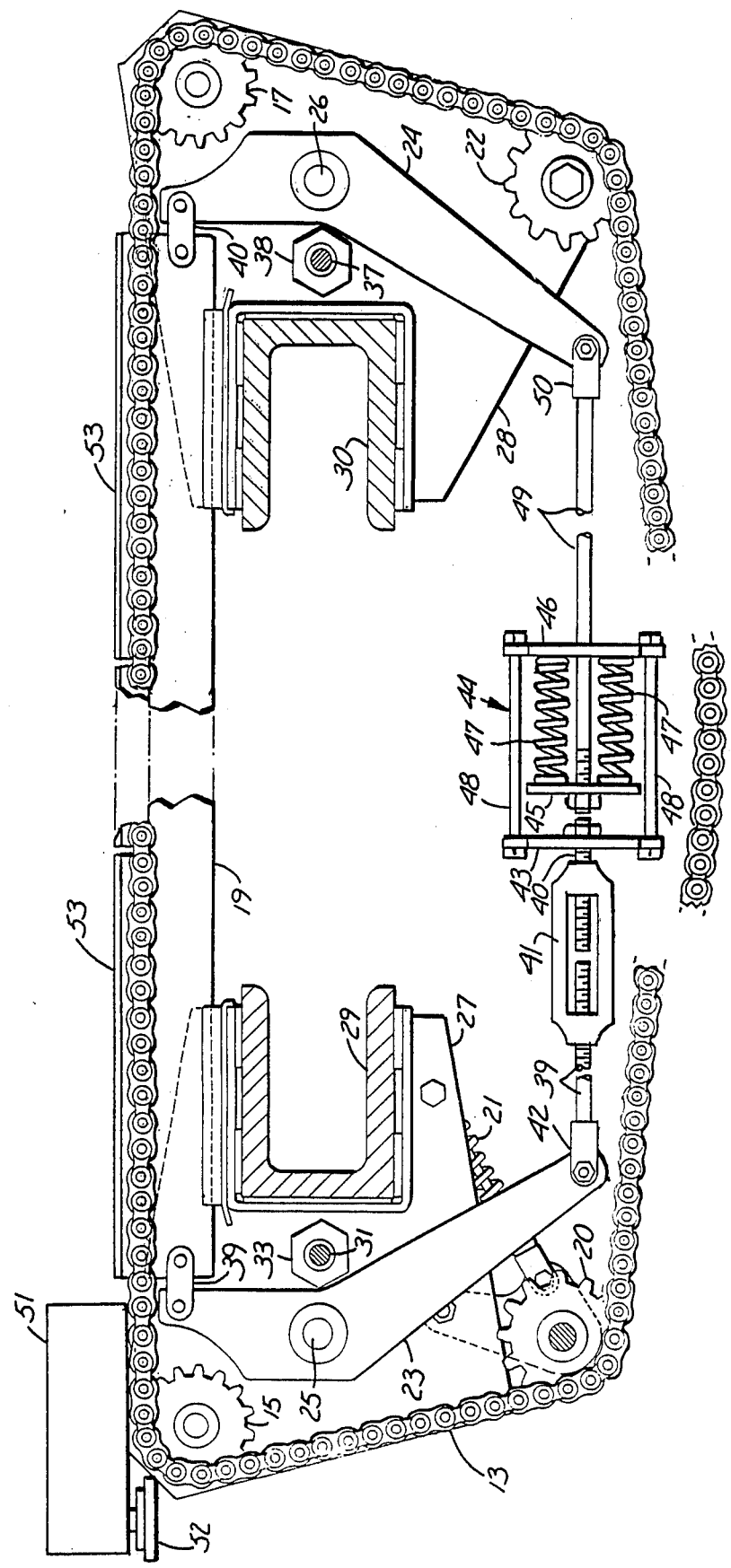
FIG. 2 shows a cross section view of a portion of FIG. 1.

This arrangement can be seen more clearly in FIG. 2 which represents a broken, cross section view of the structure shown in FIG. 1. That is, only a portion of the structure shown in FIG. 1 is also shown in FIG. 2 with breaks in the structure indicating omitted structure. FIG. 2 shows sprockets 15 and 17 at the furthest horizontal extent of chain 13 as described above, and shows therebetween guide rail 19.

Chain 13 engages two further sprockets, as can be seen in FIG. 2. One is a chain tensioning arrangement involving an idler sprocket, 20, having a spring, 21, urging the sprocket in such a manner as to keep tension on the chain as it proceeds to sprocket 15 to keep the chain tight across sprocket 15 and between sprockets 15 and 17. The chain is caused to move by an electrical stepper motor (not shown) driving a gear train (not shown) to in turn apply force to a drive sprocket, 22, which causes chain 13 to move in a clockwise direction in FIG. 2. Thus, chain 13 travels from the conveyor system 10 input near sprocket 15 to the system output near sprocket 17. Chain 12 is similarly arranged and driven.

Guide rails 18 and 19 are each supported by a corresponding pair of levers. As can be seen in FIG. 2, guide rail 19 is supported by an input end lever, 23, and an output end lever, 24. Lever 23 can rotate about a pin, 25, serving as a fulcrum. Lever 24 can also rotate about a pin, 26, again serving as a fulcrum. Fulcrum pin 25 is affixed to a plate structure, 27, to thereby support lever 23, this plate structure also supporting idler sprocket 15. Fulcrum pin 26 is affixed to a further plate structure, 28, to thereby support lever 24. Plate structure 28 also supports idler sprocket 17 and the drive shaft on which drive sprocket 22 is fitted.

Support structure 27 is in turn slidably supported by a channel beam, 29, which is part of the support frame of the solder reflow system. Similarly, structure 28 is slidably supported by another channel beam, 30, which is also part of the support frame of the system. The sliding relationship between support structure 27 and frame support 29, and between support structure 28 and frame support 30, permits structures 27 and 28 to slide laterally either way with respect to the direction of conveyance and with respect to frame supports 29 and 30, respectively. As a result, the entirety of chain 13, guide rail 19, levers 23 and 24, support structures 27 and 28, and the sprockets can move laterally within its range of motion either closer to or farther from chain 12 as indicated by the two double direction arrows in FIG. 1 near sprockets 15 and 17. Thus, the spacing between chains 12 and 13 can be adjusted to accommodate printed circuit boards of varying widths to achieve supporting these boards at the edges thereof on these chains.

The movement of chain 13, and the strutures associated therewith, is accomplished by operating a long screw, 31, through rotating it by rotating a wheel, 32, attached thereto. A nut, 33, fixed in structure 27, will move along screw 31 as this screw is turned thereby moving structure 27 with respect to screw 31 and so with respect to frame support 29. A drive sprocket, 34, at the end of screw 31 has a chain, 35, arrayed thereover and over a driven sprocket, 36, affixed to the end of another long screw, 37.

Screw 37 is fitted into a further nut, 38, fixed in structure 28 so that turning of screw 37 causes structure 28 to move with respect to screw 37 and so frame means 30. Hence, turning wheel 32 causes both screws 31 and 37 to move since moving screw 31 causes chain 35 to rotate screw 37. These screw movements cause each of structures 27 and 28 to move with nuts 33 and 38, respectively, which, being fixed therein, move because of the rotating screws. Thus, the entire arrangement involving chain 13 and guide rail 19 together move either closer to or further from the structure involving chain 12 and guide rail 18.

Guide rail 19 is shown in FIG. 2 to be connected to input end lever 23 by a link, 39. Similarly, output end lever 24 is connected to guide rail 19 by another link, 40. Links 39 and 40 are connected to guide rail 19 and levers 23 and 24, respectively, by pins allowing rotation of these links about the pins.

The opposite ends of levers 23 and 24 are connected to one another through a tensile force providing arrangement. This arrangement comprises a pair of threaded rods, 39 and 40, joined by a turnbuckle, 41. Threaded rod 39 is joined by a yoke, 42, to lever 23, yoke 42 being able to pivot with respect to lever 23 because of it being joined thereto by a pin.

Rod 40 is connected by a nut to a plate, 43, as part of a compression spring arrangement, 44. Compression spring arrangement 44 has two further plates, 45 and 46, separated by a set of compression springs, 47. Plate 46 is connected by bolts, 48, to plate 43 with plate 45 and compression springs 47 located therebetween. A further threaded rod, 49, is connected by a nut to plate 45 and passes between springs 47 through plate 46 to be connected by another yoke, 50, to lever 24. Yoke 50 is connected to lever 24 such that it can rotate with respect thereto.

The structure associated with guide rail 18 is essentially the same as that shown in FIG. 2 associated with guide rail 19. The use of nuts 33 and 38 in structures 27 and 28, respectively, does not occur in the similar structures associated with chain 12 and guide rail 18 since these are fixed with respect to frame support means 29 and 30, respectively. Rather, screws 31 and 37 pass through these similar structures without interacting with them.

Each of guide rails 18 and 19 is supported at approximately its end points only, this support provided by the associated pair of input end and output end levers. These levers can supply a considerable tensile force to these guide rails. The guide rails will tend to be straight if chosen of a relatively light construction, i.e. small cross-sectional dimensions, to thereby be relatively flexible because such a force will cause the flexible guide rail to seek a position along a straight line between the two force application points at its ends. Choosing the guide rails to have a relatively thin lateral dimension, permissible since they need not be inherently extremely rigid as will be shown below, allows the guide rail width to be chosen to accommodate a relatively narrow chain rolling thereover thereby allowing an economical choice for the chain.

Such a guide rail construction, without the application of significant tension, would provide a guide rail which would have a lateral spring constant of a few pounds per inch at most for forces applied perpendicularly to its longitudinal axis. However, the addition of a significant tensile force in the guide rail will provide a much larger effective lateral spring constant. This comes about because of the much greater restoring forces which arise as a result of any lateral deflection of the guide rail due to the large tensile force in the rail acting to keep the rail straight.

The actual tensile force appearing in either guide rail 19 (or similarly in guide rail 18) will be a multiple of the tensile force occurring between yokes 42 and 50 because of the mechanical advantage provided by levers 23 and 24. This advantage occurs because the distance from the fulcrum point in each lever to the link joining the guide rail is approximately one-third the distance from the same fulcrum point in each lever to the yoke joining the lever to the tensile force providing arrangement. Thus, in typical usage, turnbuckle 41 would be turned to the point where a tensile force pulling the bottom of levers 23 and 24 toward one another occurred at approximately 700 pounds. This force would result in imparting a tensile force within guide rail 19 (and similarly in guide rail 18) of approximately 2000 pounds. Such values can multiply the lateral spring constant of guide rail 19 or guide rail 18 by some 15 to 20 times.

At the same time, the arrangement shown in FIG. 2 permits guide rail 19 (and similarly guide rail 18) to expand without any buckling. Such buckling would otherwise occur if the ends of these guide rails were held fixed in position as portions of the interior thereof are brought to 200° C. or more for the purpose of causing the reflow of solder paste used in circuit boards passing thereover. Heating chamber 11 has not been shown in FIG. 2 for purposes of clarity, but generally, as can be seen from FIG. 1, much of guide rail 19 and chain 13 thereover will be subjected to such temperatures in heating chamber 11 while the ends of the guide rails will be much closer to the ambient temperature at which the system operates. The resulting expansion of guide rail 19 is easily taken up through use of compression spring arrangement 44 which, for the relatively small change in length of guide rail 19 because of this expansion, will continue to provide approximately a constant tension force between yokes 42 and 50.

Thus, guide rails 18 and 19 provide supports for chains 12 and 13, respectively, well adapted for carrying circuit boards supported just at the edges thereof from a room ambient temperature at the system input to the interior of heating chamber 11 and back out after reflow of the solder paste on such boards. The absence of any tendency to buckle means there will be no significant lateral displacement of portions of guide rails 18 and 19 which could otherwise lead to their separating sufficiently so circuit boards would fall into heating chamber 11. These circuit boards, supported at edges thereof by chains 12 and 13 traveling on guide rails 18 and 19, respectively, if any significant buckling of these rails were permitted, would reach a point where these chains were carried so far apart by the buckling guide rails so as to no longer support the boards. This would result in the boards falling into heating chamber 11. Thus, the use of substantial tensile forces in the guide rails with a thermal expansion accommodation to prevent any significant lateral displacement of portions of the guide rails avoids this result.

Further shown in FIG. 2 is a chain guide block, 51, which serves to keep chain 13 engaged with sprocket 15 even though the links in chain 13 may, as a result of heating, be somewhat resistant to rotating with respect to one another to go over sprocket 15. Further supported on block 51 is a rotating wheel, 52, having a shoulder which supports an entering printed circuit board to ease the transition of that board from outside the system onto chain 13. A similar structure is provided with respect to chain 12. Block 51 and roller 52 have been omitted in FIG. 1 for purposes of clarity.

A further measure is taken to assure good operation of chains 12 and 13 despite their being heated substantially in passing through heating chamber 11. Sets of radiation shields, 53, are provided over each so as to shield them from direct radiation by the radiant heating tubes present in the upper bank of heating chamber 11. Chains 12 and 13 are shielded from direct radiation due to those radiant heating tubes, 54, provided in the lower bank of heating chamber 11, as shown in FIG. 1, by guide rails 18 and 19.

Figure 3:
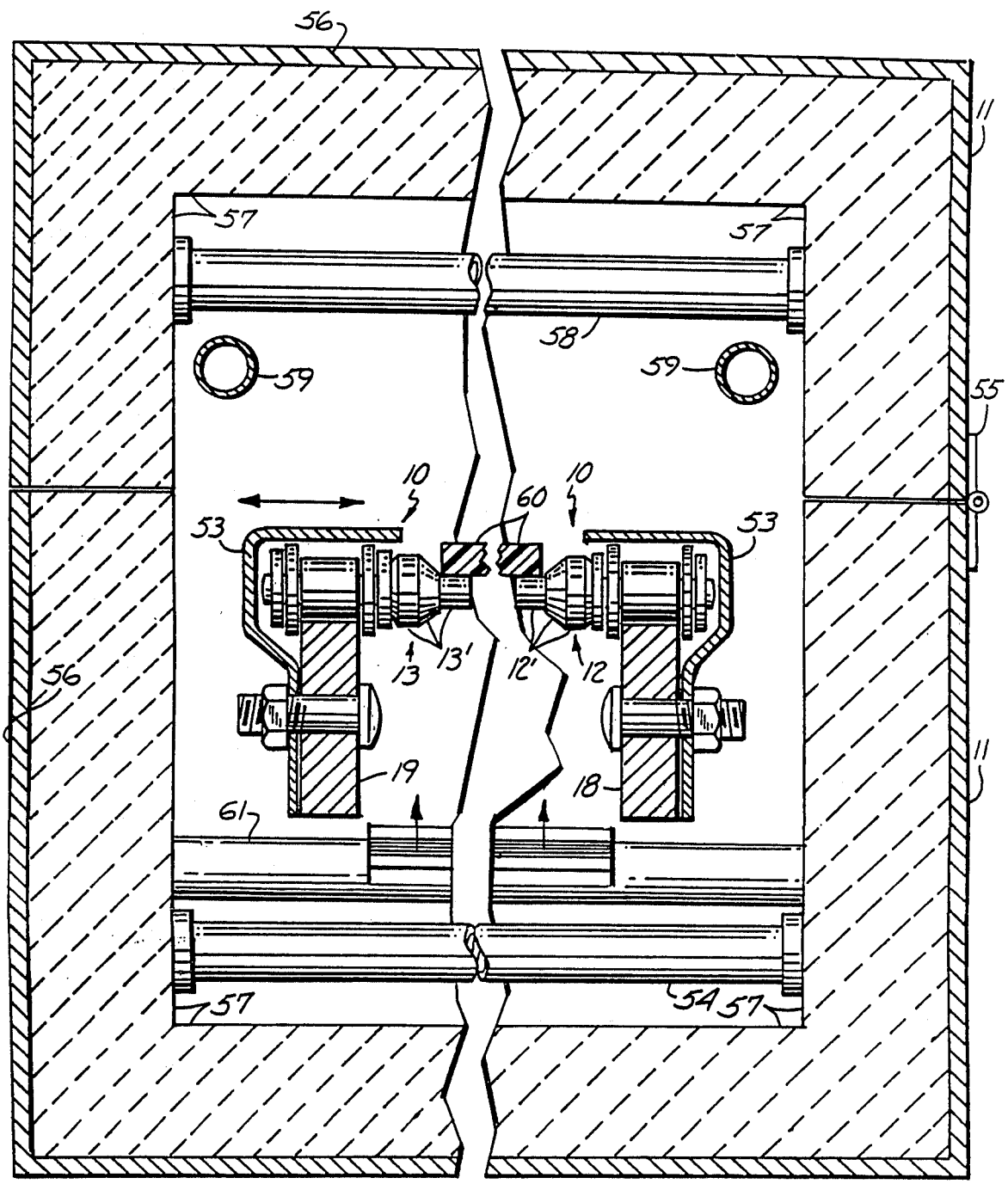
FIG. 3 shows a cross section view of a portion of FIG. 1.

Heating chamber 11 and radiation shields 53 are better seen in the broken, cross section view of FIG. 3 taken from the partial system view shown in FIG. 1. Portions of chains 12 and 13 and of the tension providing arrangement for guide rails 18 and 19 have been omitted in FIG. 3 for clarity, as have other parts of the system. The drawing has been broken down the middle to narrow it to fit on the drawing sheet.

Both the upper and lower banks of heating chamber 11 are shown in FIG. 3, and are shown hinged together by hinges, 55, to permit opening heating chamber 11 from the side opposite the hinges. Heating chamber 11 is shown to have an outer metallic shell, 56, inside of which is provided a ceramic material, 57, serving as a heat insulator. Infrared or radiant heating tubes 54 extend from the sides of insulation 57 and over a portion of insulation 57 in the lower bank of heating chamber 11. Electrical connections for tubes 54 extend through insulation 57, shell 56 and into the control system, none of which has been shown for clarity.

Similarly, radiant heating tubes, 58, are present in the upper bank of heating chamber 11 extending between sides of insulation 57 and under a portion thereof. In addition to radiant tubes 54 and 58 extending laterally with respect to the directions of travel of chains 12 and 13 during operation, a further set of radiant heating tubes, 59, extend parallel to these directions of motion between sides of insulating material 57 and under a portion theeof in the upper bank.

Guide rail 18 is shown in FIG. 3 supporting chain 12 thereon which can be seen to be a roller chain. The roller portion of the chain is on the upper surface of guide rail 18 with the chain links extending down past this upper surface to be on either side of guide rail 18 for a distance. In addition, lateral extensions, 12', in chain 12 are directed toward chain 13, these extensions 12' each having a cylindrial portion conically tapered to another cylindrical portion, the axis of symmetry of these cylinders and the cone portions all being a common axis. A similar arrangement of extensions, 13', extending in the opposite direction is provided for chain 13 supported by guide rail 19.

A portion of a printed circuit board, 60, is shown being conveyed with just its edges supported on the most inward cylindrical portion of extensions 12' and 13' of chains 12 and 13, respectively. The conical surface portions of extensions 12' and 13' serve to keep board 60 centered between these conical surfaces during its motion beginning at the conveyor access area at the system input, into and through heating chamber 11, and then out at the system output.

A pair of opposing heat shields 53 is shown in FIG. 3 with the left side one of shields 53 being bolted to guide rail 19 at its outer side, and the right side of another heat shield 53 bolted to guide rail 18 also at its outer side. Each of shields 53 extends outward and upward from the guide rails to which they are affixed and then over the corresponding chains. Thus, right side heat shield 53 has a portion over the upper surfaces of chain 12, and left side heat shield 53 has a portion extending over the upper surfaces of chain 13. A similar mounting arrangement occurs for each heat shield 53 shown in FIG. 1.

These shields are provided to reduce the heating of chains 12 and 13 in conveyor 10 and the guide rails on which they are supported by, as indicated, blocking direct radiation from radiant tubes 58 to these chains and guide rails. As shown in FIG. 1, there are four shields 53 over each of chains 12 and 13. They are broken into sections along each guide rail to avoid having them subjected to the same risk of buckling because of the heat generated in heating chamber 11. In addition, shields 53 are bolted with relatively little compressive force so that they are able to slide under the bolts as they expand and contract due to the heating and cooling thereof during and after system operation.

Further shown in FIG. 3 is a nozzle means, 61, which is supplied with a cooling gas, typically air, from an input manifold, 62, shown in FIG. 1. Manifold 62 can be connected to a source of gas, such as air, which is under a pressure greater than that of the ambient conditions in which the system operates. This provides the opportunity to cool the lower side of a board 60 as it passes through heating chamber 11 while radiantly heating the upper side thereof by infrareed radiation from radiant tubes 58. Such a capability is desired in some situations in the mounting of electronic components of some kinds on circuit boards.

Finally, a bank of fans, 63, is shown positioned toward the end of conveyor 10 near the output of the system in FIG. 3. Fans 63 provide a strong cooling gas flow to rapidly cool circuit boards 60 after they emerge from heating chamber 11.

Figure 4:
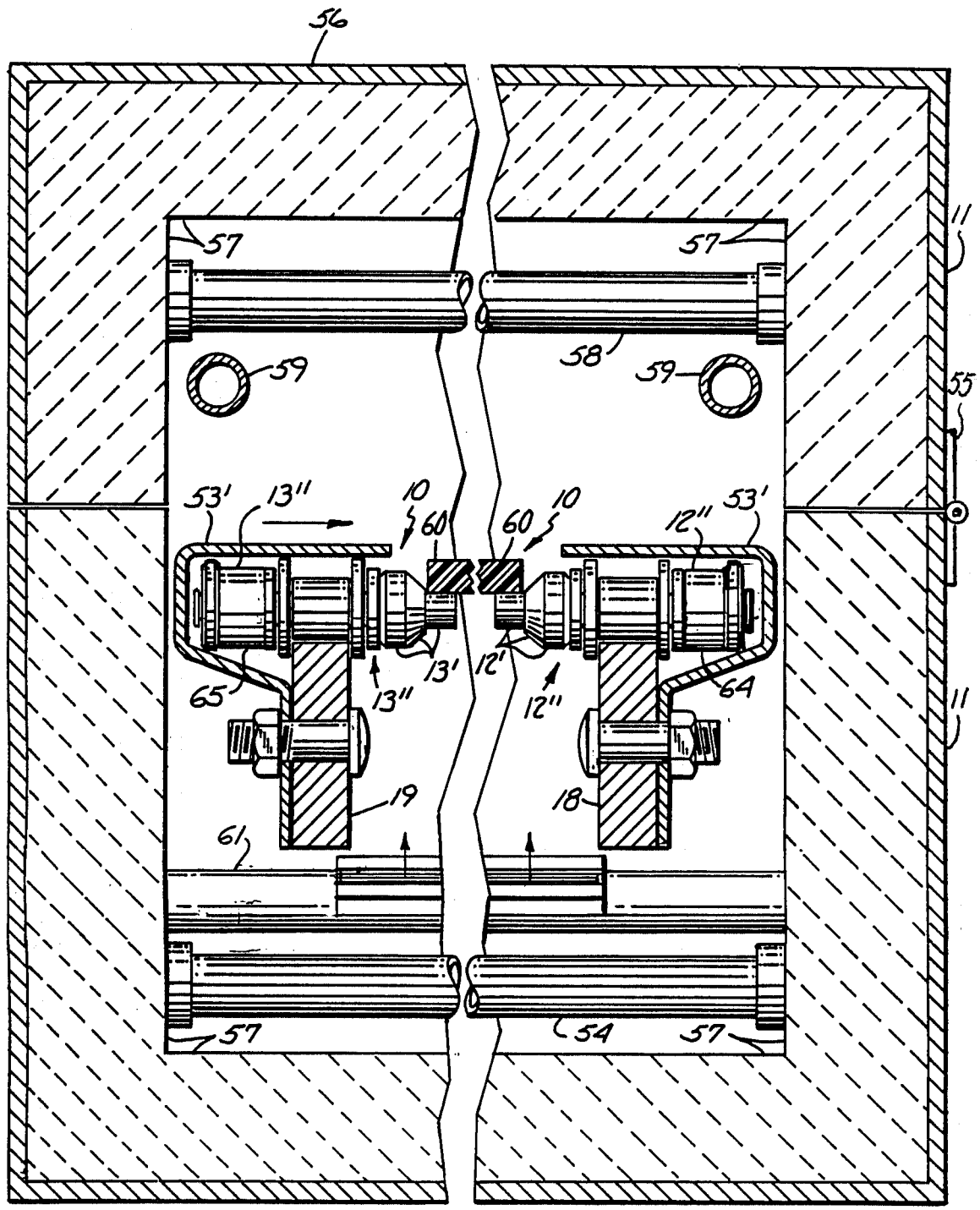
FIG. 4 shows a cross section view alternative to that shown in FIG. 3.

FIG. 4 shows a chain and heat shield arrangement alternative to that shown in FIG. 3. In this arrangement, extension, 12" and 13", of chains 12 and 13 are provided on the opposite side of the extensions 12' and 13' of each of the board carrying chains now redesignated 12A and 13A. Extensions 13" and 13" have rollers, 64 and 65, mounted thereon so that the weight of circuit board 60 will at most cause rollers 64 and 65 to swing up and run against the upper portions of the heat shields now redesignated as 53'. This arrangement will reduce wear on the links which can occur in the arrrangement of FIG. 3 to the extent these links tend to rub against the upper edges of heat shields 53.

Although the present invention has been described with reference to preferred embodiments, workers skilled in the art will recognize that changes may be made in form and detail without departing from the spirit and scope of the invention.

What is claimed is:

1. A conveyor having a guide rail for guiding a movable transport member during motion thereof between first and second ends of said guide rail so that said movable transport member can convey selected objects placed thereon between first and second ends of said conveyor, respectively, said guide rail being subject to forces which can cause displacement of portions thereof in directions substantially perpendicular to directions of motion followed by said movable transport member, said conveyor comprising:
a support frame means located at least in part between said conveyor first and second ends; and
tension imparting means affixed to said frame means and to each of said guide rail first and second ends, said tension imparting means being capable of establishing a tensile force between said guide rail first and second ends to thereby stiffen said guide rail against forces which could otherwise result in said substantially perpendicular displacement.

2. The apparatus of claim 1 wherein said movable transport member is a chain.

3. The apparatus of claim 2 wherein said chain has portions thereof around at least portions of said guide rail.

4. The apparatus of claim 2 wherein said chain has a plurality of extension portions extending from one side thereof with at least some of said extension portions each having a cylindrical part and a conical part such that an axis of symmetry of each forms a common axis.

5. The apparatus of claim 2 wherein a plurality of shield portions are slidably affixed to said guide rail and extend from a side thereof over that side of said chain opposite that side of said chain facing said guide rail.

6. The apparatus of claim 4 wherein said chain has a plurality of rollers extending from a side thereof opposite that from which said plurality of extension portion extends.

7. The apparatus of claim 1 wherein said tension imparting means comprises a pair of levers each with its fulcrum affixed to said support frame means and each having an end thereof affixed to one of said guide rail first and second ends, said pair of levers having that end thereof remaining of each connected to a tensile force setting means.

8. The apparatus of claim 7 wherein said tensile force setting means is a pair of rods connected by a compression spring arrangement with there being an opposite end of one of said rods connected through a turnbuckle to one of said levers.

9. The apparatus of claim 1 wherein said guide rail is a first guide rail and wherein said conveyor further comprises a second guide rail for guiding said movable transport member between first and second ends of said second guide rail during motion thereof, said second guide rail being adjustable in its spacing from said first guide rail.

10. The apparatus of claim 9 wherein said tension imparting means is a first tension imparting means and wherein said conveyor further comprises a second tension imparting means affixed to said frame means and to each of said second guide rail first and second ends, said second tension imparting means being capable of establishing a tensile force between said second guide rail first and second ends to thereby stiffen said second guide rail.

11. The apparatus of claim 10 wherein said movable transport member is formed by first and second chains.

12. The apparatus of claim 11 wherein said first chain has portions thereof around at least portions of said first guide rail, and said second chain has portions thereof around at least portions of said second guide rail.

13. The apparatus of claim 11 wherein each of said first and second chains has a plurality of extension portions extending from one side thereof with at least some of said extension portions each having a cylindrical part and a conical part such that an axis of symmetry of each forms a common axis.

14. The apparatus of claim 11 wherein a first plurality of shield portions are slidably affixed to said first guide rail and extend from a side thereof to be over that side of said first chain opposite that side of said first chain facing said first guide rail, and wherein a second plurality of shield portions are slidably affixed to said second guide rail and extend from a side thereof to be over that side of said second chain opposite that side of second chain facing said second guide rail.

15. The apparatus of claim 11 wherein each of said first and second guide rails are subject to having an interior portion thereof being brought to a temperature significantly differing from that occurring at least at one of said first and second ends.

16. The appartus of claim 13 wherein each of said first and second chains has a plurality of rollers extending from a side threof opposite that from which its said plurality of extension portions extends.

17. The apparatus of claim 14 wherein each of said first and second guide rails are subject to having an interior portion thereof being brought to a temperature significantly differing from that occurring at least at one of said first and second ends.

18. The apparatus of claim 15 wherein said interior portions of said first and second guide rails are brought to elevated temperatures significantly above those occurring at one of said first and second ends of a corresponding one of said first and second guide rails by radiant heating means.

19. The apparatus of claim 1 wherein said guide rail is subject to having an interior portion thereof being brought to a temperature significantly differing from that occurring at least at one of said guide rail first and second ends.

20. The apparatus of claim 17 wherein said interior portion of said guide rail is brought to an elevated temperature significantly above that occurring at one of said guide rail first and second ends by radiant heating means

* * * * *